United States Patent
Torii

(10) Patent No.: US 11,969,856 B2
(45) Date of Patent: Apr. 30, 2024

(54) WAFER MANUFACTURING METHOD AND WAFER

(71) Applicant: SUMCO CORPORATION, Tokyo (JP)

(72) Inventor: Kantarou Torii, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 394 days.

(21) Appl. No.: 17/418,087

(22) PCT Filed: Nov. 8, 2019

(86) PCT No.: PCT/JP2019/043881
§ 371 (c)(1),
(2) Date: Jun. 24, 2021

(87) PCT Pub. No.: WO2020/137186
PCT Pub. Date: Jul. 2, 2020

(65) Prior Publication Data
US 2022/0097200 A1 Mar. 31, 2022

(30) Foreign Application Priority Data
Dec. 27, 2018 (JP) ................. 2018-245301

(51) Int. Cl.
*B24B 37/04* (2012.01)
*H01L 21/02* (2006.01)

(52) U.S. Cl.
CPC ...... *B24B 37/042* (2013.01); *H01L 21/02024* (2013.01)

(58) Field of Classification Search
CPC ......... H01L 21/02005; H01L 21/02008; H01L 21/0201; H01L 21/02013; H01L 21/02016;
(Continued)

(56) References Cited

U.S. PATENT DOCUMENTS 7,582,221 B2   9/2009 Netsu et al.
8,118,646 B2   2/2012 Sato et al.
(Continued)

FOREIGN PATENT DOCUMENTS

CN   1394355 A   1/2003
CN   102124546 A   7/2011
(Continued)

OTHER PUBLICATIONS

Machine Translation of JP 2002-299290 (Year: 2002).*
(Continued)

*Primary Examiner* — Zachary M Davis
(74) *Attorney, Agent, or Firm* — GREENBLUM & BERNSTEIN, P.L.C.

(57) ABSTRACT

A manufacturing method of a wafer with a notch includes: polishing principal surfaces of the wafer; mirror-polishing a notch chamfered portion of the notch; mirror-polishing an outer-periphery chamfered portion of an outer peripheral portion of the wafer; and finish-polishing one of principal surfaces of the wafer, the finish-polishing being performed after performing the mirror-polishing of the notch chamfered portion, the polishing of the principal surfaces, and the mirror-polishing of the outer-periphery chamfered portion in this order.

3 Claims, 7 Drawing Sheets

(58) Field of Classification Search
CPC ......... H01L 21/02019; H01L 21/02021; H01L 21/02024
See application file for complete search history.

(56) References Cited

U.S. PATENT DOCUMENTS

| | | | |
|---|---|---|---|
| 9,293,318 | B2 | 3/2016 | Yamashita |
| 2001/0041513 | A1* | 11/2001 | Nishi ..................... B24D 5/02 257/E21.237 |
| 2009/0057840 | A1 | 3/2009 | Netsu et al. |

FOREIGN PATENT DOCUMENTS

| | | |
|---|---|---|
| CN | 104350583 A | 2/2015 |
| JP | 2002-299290 | 10/2002 |
| JP | 2014-229650 | 12/2014 |
| JP | 2017-157796 | 9/2017 |

OTHER PUBLICATIONS

International Preliminary Report on Patentability issued in International Patent Application No. PCT/JP2019/043881, dated Jan. 28, 2020, along with an English translation thereof.

Official Communication issued in International Bureau of WIPO Patent Application No. PCT/JP2019/043881, dated Jan. 28, 2020, along with an English translation thereof.

Office Action issued in Chinese Patent Application 201980086186. 8, dated Dec. 26, 2022, together with an English translation.

* cited by examiner

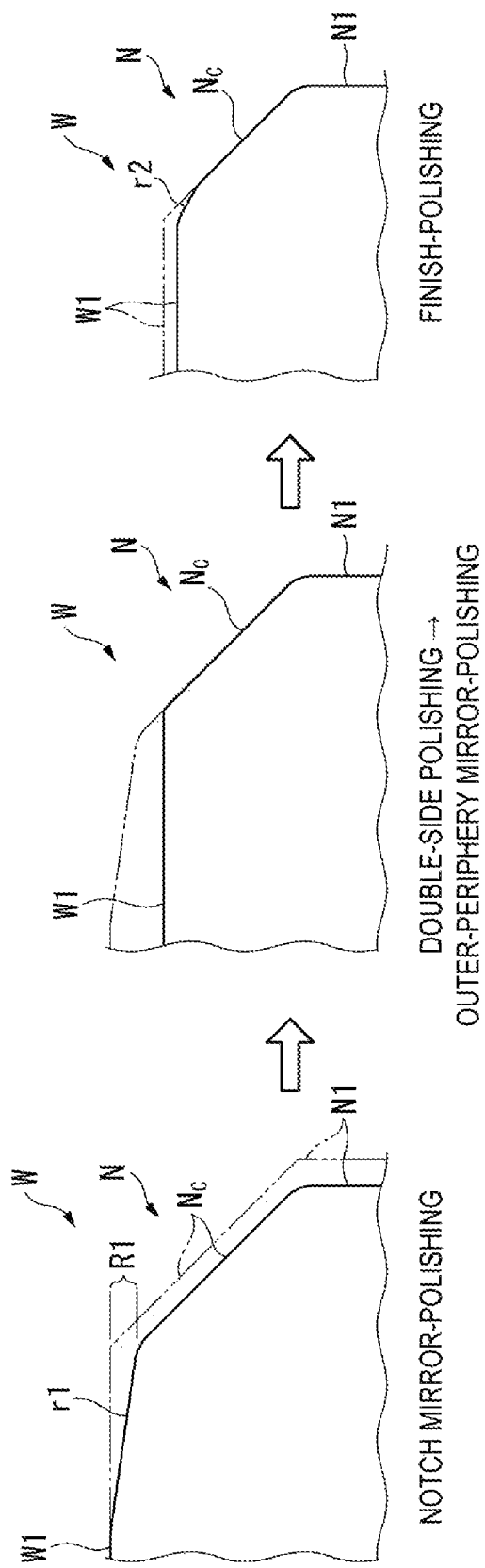

US 11,969,856 B2

WAFER MANUFACTURING METHOD AND WAFER

TECHNICAL FIELD

The present invention relates to a wafer manufacturing method and a wafer.

BACKGROUND ART

Studies for improving flatness of a part of a wafer near a notch have been made so far (see, for instance, Patent Literature 1).

Patent Literature 1 discloses that a sum of a notch depth and a radial width of a chamfered portion of the notch is adjusted to 900 μm or less.

CITATION LIST

Patent Literature

Patent Literature 1: JP 2017-157796 A

SUMMARY OF THE INVENTION

Problems to be Solved by the Invention

However, the process disclosed in Patent Literature 1, which requires adjustment of the notch depth in order to improve the flatness of the part near the notch, sometimes results in the notch of a depth unusable in subsequent step(s).

An object of the invention is to provide a wafer manufacturing method capable of improving the flatness of the part near the notch without changing a shape of the notch, and a wafer.

Means for Solving the Problems

A manufacturing method according to an aspect of the invention is for manufacturing a wafer including a notch, the method including: polishing principal surfaces of the wafer; mirror-polishing a notch chamfered portion of the notch; mirror-polishing an outer-periphery chamfered portion of an outer periphery of the wafer; and finish-polishing one of the principal surfaces of the wafer, in which the finish-polishing is performed after performing the mirror-polishing of the notch chamfered portion, the polishing of the principal surfaces, and the mirror-polishing of the outer-periphery chamfered portion in this order.

According to the above aspect of the invention, the flatness of the part near the notch can be improved without changing the shape of the notch.

In the manufacturing method of a wafer according to the above aspect of the invention, it is preferable that the wafer is a silicon wafer.

A wafer according to another aspect of the invention includes a notch, in which an edge roll-off amount of a notch chamfered portion of the notch is smaller than an edge roll-off amount of an outer-periphery chamfered portion of an outer peripheral portion of the wafer.

BRIEF EXPLANATION OF DRAWING(S)

FIG. 3B is a schematic illustration showing a progress of polishing of a notch according to the exemplary embodiment.

FIG. 7 is a flowchart showing the wafer manufacturing method according to the exemplary embodiment.

FIG. 8 is a graph showing results of Examples of the invention.

DESCRIPTION OF EMBODIMENT(S)

Related Art

Initially, a wafer manufacturing method disclosed in Patent Literature 1 will be described below as a related art of the invention.

Figure 1:
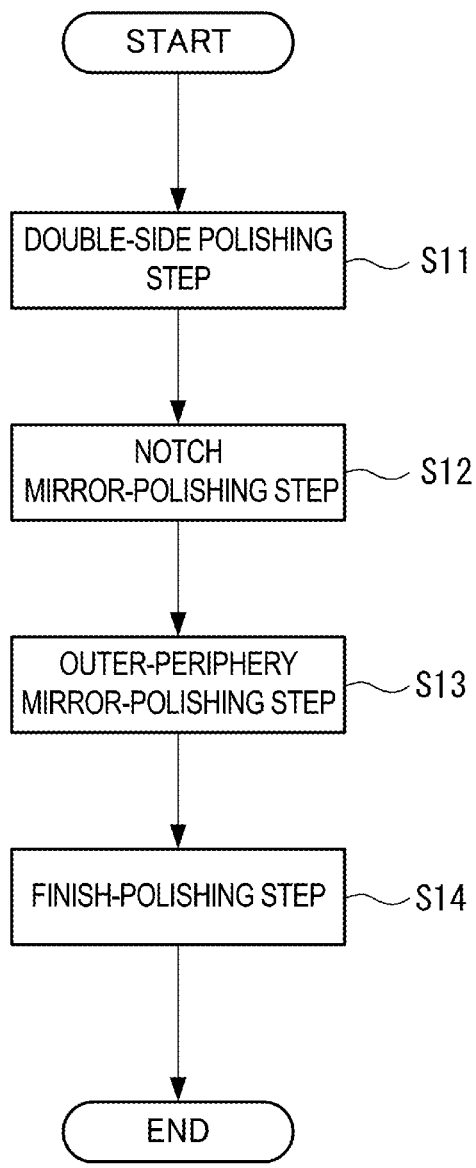
FIG. 1 is a flowchart of a wafer manufacturing method according to a related art of the invention.

The wafer manufacturing method according to the related art includes a double-side polishing step S11 of lapping principal surfaces of a wafer, a notch mirror-polishing step S12 of mirror-polishing a chamfered portion of a notch of the wafer after being processed in the double-side polishing step S11, an outer-periphery mirror-polishing step S13 of mirror-polishing a chamfered portion of an outer peripheral portion except for the notch of the wafer after being processed in the notch mirror-polishing step S12, and a finish-polishing step S14 of finish-polishing one of the principal surfaces of the wafer after being processed in the outer-periphery mirror-polishing step S13, as shown in FIG. 1.

Details of the steps will be described below.

Double-Side Polishing Step

Figure 2:
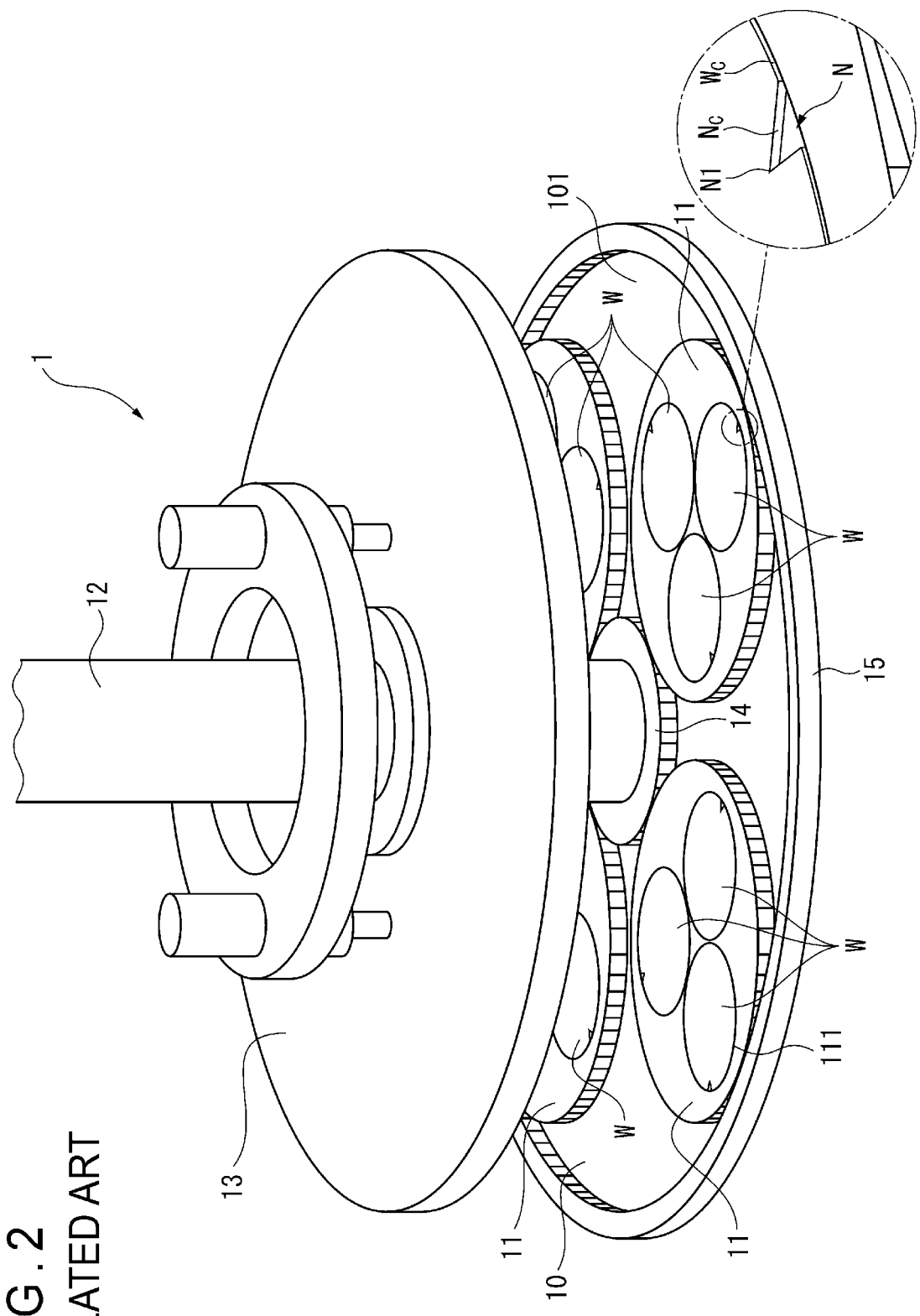
FIG. 2 is a schematic illustration of a double-side polishing machine used in the wafer manufacturing method according to the related art and a wafer manufacturing method according to an exemplary embodiment of the invention.

Initially, wafers W each having a notch N as shown in FIG. 2 are prepared. An outer-periphery chamfered portion $W_C$ and a notch chamfered portion $N_C$ (see FIG. 4A) are provided on the outer peripheral portion and the notch N of each of the wafers W, respectively, through a primary chamfering step.

Using a double-side polishing machine 1, first and second principal surfaces W1, W2 of each of the wafers W are lapped to improve the flatness of the wafers W.

Initially, after carriers 11 are set in a lower platen 10 and the wafers W are put into respective holes 111, an upper platen 13 is lowered and pressed by an elevation mechanism 12 downwardly at a predetermined pressure. Then, while supplying polishing slurry through a hole (not shown) provided in the upper platen 13, the lower platen 10, the upper platen 13, an inner gear 14, and an outer gear 15 are independently rotated around respective centers to lap the first and second principal surfaces W1, W2 with a polishing pad (not shown) of the upper platen 13 and a polishing pad 101 of the lower platen 10. Margin for the double-side polishing per one side is preferably in a range from 3 µm to 13 µm.

Figure 3A:
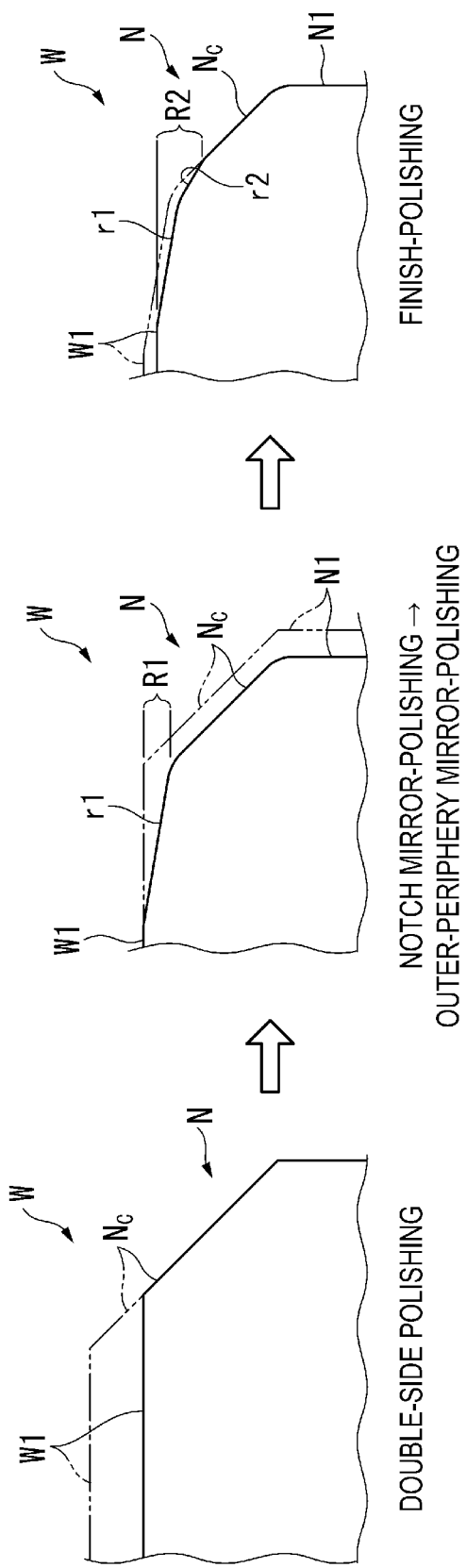
FIG. 3A is a schematic illustration showing a progress of polishing of a notch according to the related art.

At the time of the double-side polishing, since the polishing pads of the platens 10, 13 are made of a material with a high hardness (e.g. foamed polyurethane), the polishing progresses so as to lap the principal surfaces W1, W2. Consequently, as shown in a left figure in FIG. 3A, the notch N, whose profile is as shown by chain double-dashed lines before the double-side polishing, exhibits the profile represented by solid lines after the double-side polishing. At this time, though being made of the hard material, the polishing pad is slightly dented during the polishing, so that a minute rounded edge (edge roll-off) is formed at each of border regions between the principal surfaces W1, W2 and the outer-periphery chamfered portion $W_C$ and at each of border regions between the principal surfaces W1, W2 and the notch chamfered portion $N_C$.

Notch Mirror-Polishing Step

Figure 4A:
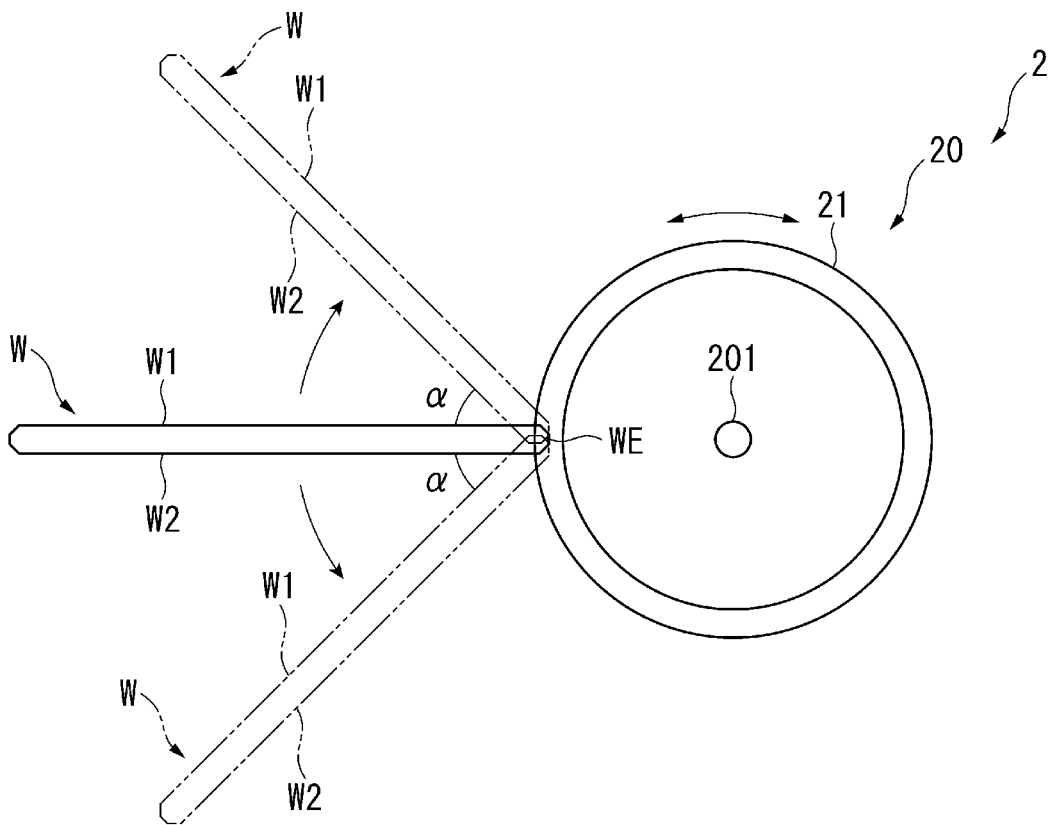
FIG. 4A is a side elevational view of a notch polishing unit used in the wafer manufacturing method according to the related art and the wafer manufacturing method according to the exemplary embodiment.
Figure 4B:
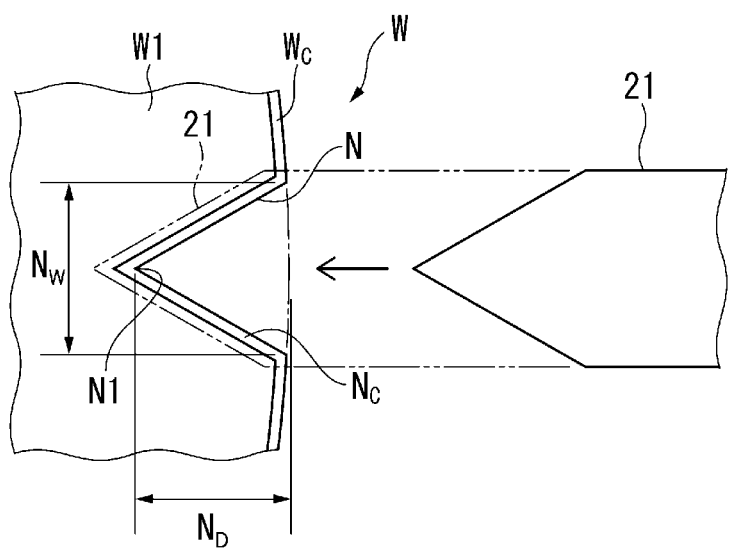
FIG. 4B is a partially enlarged view of the notch polishing unit used in the wafer manufacturing method according to the related art and the wafer manufacturing method according to the exemplary embodiment.

Next, the notch chamfered portion $N_C$ of the wafer W is mirror-polished using a notch polishing unit 2 as shown in FIGS. 4A and 4B.

Initially, the wafer W is held by a suction holder (not shown). Subsequently, as shown in FIG. 4A, a disc-shaped notch polishing wheel 20 whose planar direction is orthogonal to a planar direction of the wafer W is rotated around a rotation axis 201. A notch polishing wheel 20 and the wafer W are relatively moved to bring a polishing pad 21 provided all over an outer periphery of the notch polishing wheel 20 into contact with the notch N of the wafer W as shown in chain double-dashed line in FIG. 4B, thereby mirror-polishing the notch N. Further, as shown in chain double-dashed lines in FIG. 4A, with the wafer W being inclined around a point near an edge WE upward and downward each by an angle α and a rotation direction of the notch polishing wheel 20 being adjusted, the polishing pad 21 is brought into contact with the notch N for a predetermined time at each posture to perform mirror-polishing. Margin for the notch mirror-polishing step is preferably in a range from 2 µm to 8 µm.

At the time of the notch mirror-polishing, since the polishing pad 21 is made of a soft unwoven cloth and the wafer W is inclined during the mirror-polishing, the polishing process progresses while the polishing pad 21 extends not only over an end portion N1 and the notch chamfered portion $N_C$ of the notch N but also over the first principal surface W1 and the second principal surface W2 of the wafer W (sometimes referred to as "over polishing" hereinafter). When such an over polishing occurs, the end portion N1 and the notch chamfered portion $N_C$ of the notch N are mirror-polished as shown in a central figure in FIG. 3A, creating a rounded surface r1 at the border region between the notch chamfered portion $N_C$ and each of the first principal surface W1 and the second principal surface W2, resulting in a large rounded edge R1. This rounded edge R1 is by far larger than a rounded edge formed at the above-described double-side polishing and a rounded edge formed during subsequent outer-periphery mirror-polishing and finish polishing.

Outer-Periphery Mirror-Polishing Step

Figure 5A:
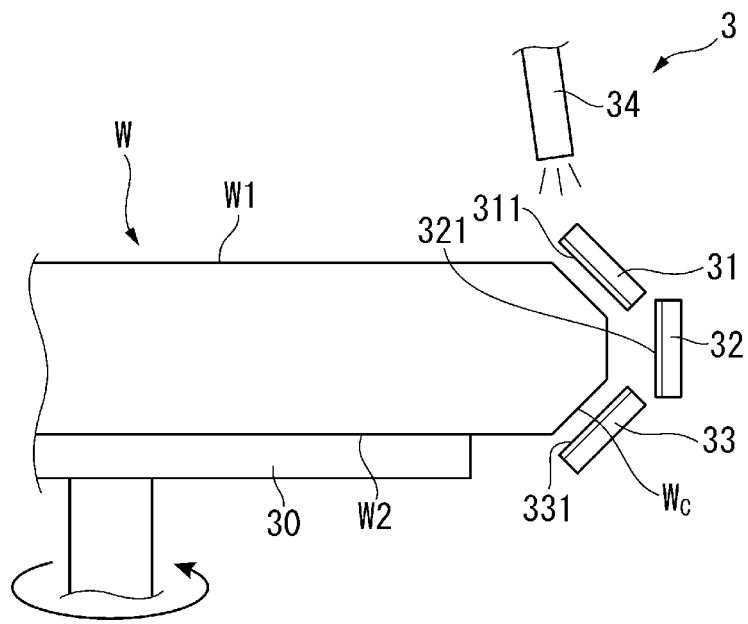
FIG. 5A is a side elevational view of an outer-periphery polishing unit used in the wafer manufacturing method according to the related art and the wafer manufacturing method according to the exemplary embodiment.
Figure 5B:
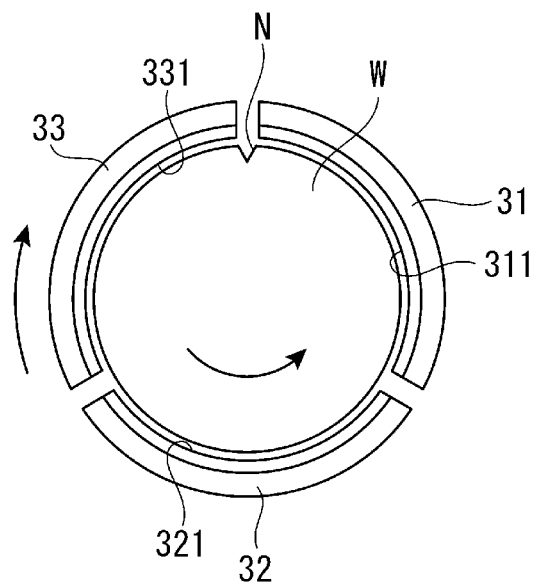
FIG. 5B is a plan view of the outer-periphery polishing unit used in the wafer manufacturing method according to the related art and the wafer manufacturing method according to the exemplary embodiment.

Next, the outer-periphery chamfered portion We of the wafer W is subjected to mirror-polishing using an outer-periphery polishing unit 3 as shown in FIGS. 5A and 5B.

Initially, the wafer W is held by a suction holder 30. Subsequently, polishing pads 311, 321, 331 of an upper-slant polisher 31, a vertical-surface polisher 32, and a lower-slant polisher 33, respectively, are pressed against the outer peripheral portion of the wafer W at a predetermined pressure. It should be noted that the polishing pads 311, 321, 331, which are illustrated to be arranged at the right side of the wafer W in FIG. 5A for the purpose of clearly showing a positional relationship between the wafer W and the outer peripheral portion, are actually arc-shaped components disposed circumferentially around the wafer W as shown in FIG. 5B.

Then, upper, central, and lower portions of the outer-periphery chamfered portion $W_C$ are mirror-polished by the polishing pad 311, the polishing pad 321, and the polishing pad 331, respectively, by rotating the suction holder 30 to rotate the wafer W and simultaneously rotating the polishers 31, 32, 33 while supplying polishing slurry to the polishing pads 311, 321, 331 through a pipe 34. Margin for the outer-periphery mirror-polishing is preferably in a range from 2 µm to 8 µm.

During the outer-periphery mirror-polishing, the polishing pads 311, 321, 331, which are each made of a soft unwoven cloth, become greatly dented, creating a small rounded edge at a border region between the outer-periphery chamfered portion $W_C$ and each of the principal surfaces W1, W2. The rounded edge is larger than the rounded edge formed at the double-side polishing.

In contrast, since the polishing pads 311, 321, 331 are not in contact with an interior of the notch N, the notch N is not polished. Consequently, the notch N after the outer-periphery mirror-polishing is kept in the profile after the notch mirror-polishing represented by solid lines shown in the central figure in FIG. 3A.

Finish-Polishing Step

Figure 6:
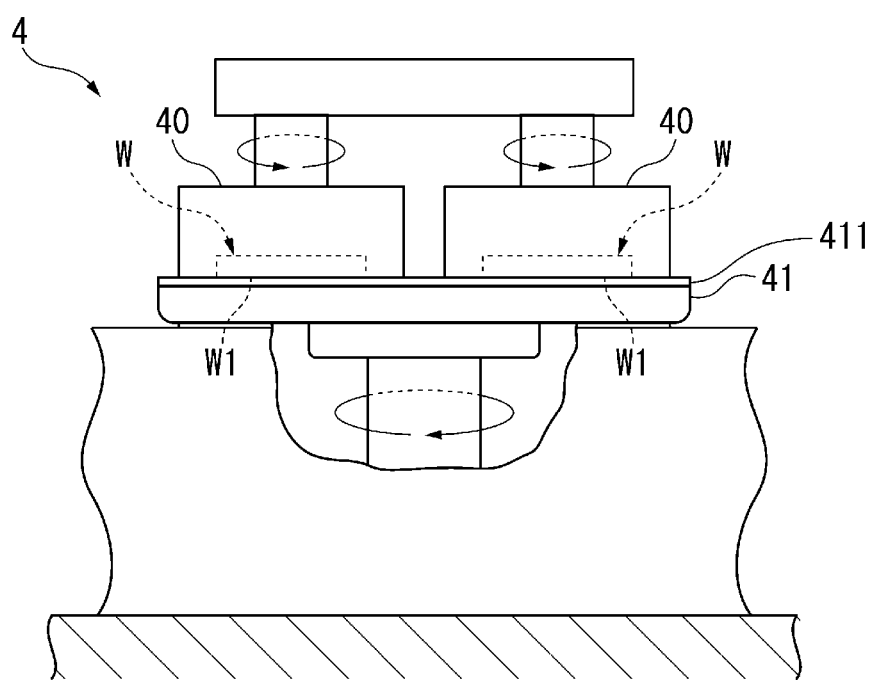
FIG. 6 is a schematic illustration of a finish-polishing unit used in the wafer manufacturing method according to the related art and the wafer manufacturing method according to the exemplary embodiment.

Subsequently, using a finish-polishing unit 4 as shown in FIG. 6, the first principal surface W1 of the wafer W is finish-polished to remove a processing damage caused by the rough polishing and reduce a surface roughness of the first principal surface W1.

Initially, the wafer W is held by a wafer chuck (not shown) of a polishing head 40. Next, a platen 41 is rotated and polishing slurry is supplied on a polishing pad 411 on the surface of the platen 41. Then, the polishing head 40 is lowered while being rotated to bring the wafer W into contact with the polishing pad 411, thereby finish-polishing the first principal surface W1. Margin for the finish-polishing is preferably in a range from 0.4 µm to 1.2 µm.

During the finish-polishing, the first principal surface W1 and the rounded surface r1 are ground for the same margins, hardly changing the rounded edge R1 of the rounded surface r1. The finish-polishing, in which the polishing pad 411 is made of a soft polyurethane resin and a rounded surface r2 is formed at the border region between the rounded surface r1 and the notch chamfered portion $N_C$ during the finish-polishing, turns the profile of the notch N from the profile immediately before the finish-polishing represented by chain double-dashed lines to the profile represented by solid lines in the right figure in FIG. 3A. Consequently, a rounded edge R2 after the finish-polishing becomes larger than the rounded edge R1 after the outer-periphery mirror-polishing.

A small rounded edge is also formed at a border region between the first principal surface W1 and the outer-periphery chamfered portion $W_C$. This rounded edge is of an approximately the same size as the rounded edge formed at the border region (i.e. the rounded surface r2) between the rounded surface r1 and the notch chamfered portion $N_C$. As a result, the rounded edge at the border region between the first principal surface W1 and the outer-periphery chamfered portion $W_C$ after the finish-polishing becomes slightly larger than the rounded edge before the finish-polishing.

Exemplary Embodiment

Next, a wafer manufacturing method according to an exemplary embodiment of the invention will be described below.

As shown in FIG. 7, the wafer manufacturing method includes a notch mirror-polishing step S1 of mirror-polishing the notch chamfered portion $N_C$, a double-side polishing step S2 of lapping the principal surfaces of the wafer W after being processed in the notch mirror-polishing step S1, an outer-periphery mirror-polishing step S3 of mirror-polishing the outer-periphery chamfered portion We of the wafer W after being processed in the double-side polishing step S2, and a finish-polishing step S4 of finish-polishing the first principal surface W1 of the wafer W after being processed in the outer-periphery mirror-polishing step S3. In other words, the wafer manufacturing method according to the present exemplary embodiment differs from that of the related art in that the notch mirror-polishing step is firstly performed.

It should be noted that the wafer is exemplarily made of a material such as silicon, germanium, gallium arsenide, gallium phosphide, and indium phosphide.

Notch Mirror-Polishing Step

Initially, the notch N of the wafer W is mirror-polished using the same apparatus and under the same conditions as those in the notch mirror-polishing step S12 of the related art.

During the mirror-polishing, since the polishing pad 21 is made of a soft unwoven cloth and the mirror-polishing is performed while the wafer W is inclined, a large rounded edge R1 is formed at the border region between each of the principal surfaces W1, W2 and the notch chamfered portion $N_C$ as shown in a left figure in FIG. 3B.

It should be noted that a foamed polyurethane or polyester unwoven cloth is optionally used as a component of the polishing pad 21.

A hardness of the polishing pad 21 is preferably in a range from 70 to 80. The hardness exceeding 80 can result in insufficient polishing of the notch chamfered portion $N_C$. In contrast, the hardness of less than 70 can deteriorate the shape of the part of the wafer W near the notch N due to over-polishing.

Double-Side Polishing Step

Subsequently, the principal surfaces W1, W2 of the wafer W are lapped using the same apparatus and under the same conditions as those in the double-side polishing step S11 of the related art.

The margin removed during the double-side polishing is larger than that in the finish-polishing. Consequently, the notch N, whose profile is as shown by chain double-dashed lines in a left figure in FIG. 3B before the double-side polishing, exhibits the profile represented by solid lines shown in the left figure in FIG. 3B after the double-side polishing, where the rounded edge R1 at the border portions between the principal surfaces W1, W2 and the notch chamfered portion $N_C$ is eliminated.

However, since the polishing pad is slightly dented during the double-side polishing as described above, a minute rounded edge is eventually formed at each of border regions between the principal surfaces W1, W2 and the outer-periphery chamfered portion $W_C$ and at each of border regions between the principal surfaces W1, W2 and the notch chamfered portion $N_C$.

Outer-Periphery Mirror-Polishing Step

Subsequently, the outer-periphery chamfered portion $W_C$ of the wafer W is mirror-polished using the same apparatus and under the same conditions as those in the outer-periphery mirror-polishing step S13 of the related art.

During the outer-periphery mirror-polishing, while a small rounded edge is formed at the border regions between the principal surfaces W1, W2 and the outer-periphery chamfered portion $W_C$, the small rounded edge is not formed at the border regions between the principal surfaces W1, W2 and the notch chamfered portion $N_C$. Consequently, the profile of the notch N is hardly changed from the profile immediately before the outer-periphery mirror-polishing represented by solid lines in a central figure in FIG. 3B.

Finish-Polishing Step

Subsequently, the first principal surface W1 of the wafer W is finish-polished using the same apparatus and under the same conditions as those in the finish-polishing step S14 of the related art.

After performing the finish-polishing, the outer-periphery chamfered portion $W_C$ and the notch chamfered portion $N_C$ are ground by the same margin, so that the notch N, whose profile is as shown by chain double-dashed lines immediately before the finish-polishing, exhibits the profile with the rounded surface r2 being formed as shown by solid lines in a right figure in FIG. 3B.

During the finish-polishing, the small rounded surface r2 is formed at each of the border regions between the first principal surface W1 and the notch chamfered portion $N_C$ and between the first principal surface W1 and the outer-periphery chamfered portion $W_C$, as described above. Before the finish-polishing, a small rounded edge is formed by the outer-periphery mirror-polishing at the border region between the first principal surface W1 and the outer-periphery chamfered portion $W_C$. Accordingly, the size (length in the thickness direction) of the rounded edge at the border region between the first principal surface W1 and the outer-periphery chamfered portion $W_C$ after the finish-polishing becomes slightly larger than the rounded edge before the finish-polishing.

In contrast, before the finish-polishing, a minute rounded edge, whose size is by far smaller than the rounded edge formed during the finish-polishing, is formed by the double-side polishing at the border region between the first principal surface W1 and the notch chamfered portion $N_C$, to which no rounded edge is formed by the outer-periphery mirror-polishing. Accordingly, the profile of the rounded edge at the border region between the first principal surface W1 and the notch chamfered portion $N_C$ after the finish-polishing becomes substantially coincides with the profile of the rounded edge formed during the finish-polishing (i.e. the rounded surface r2). In other words, the size (length in the thickness direction) of the rounded edge at the border region between the first principal surface W1 and the notch chamfered portion $N_C$ becomes smaller than that of the rounded edge at the border region between the first principal surface W1 and the outer-periphery chamfered portion $W_C$.

Further, the rounded edge formed during the finish-polishing is by far smaller than the rounded edge formed during the notch mirror-polishing. Accordingly, the profile of the border region between the first principal surface W1 and the notch chamfered portion $N_C$ after the finish-polishing becomes substantially coincides with the profile applied with the rounded surface r2 formed during the finish-polishing as shown by solid lines in the right figure in FIG. 3B.

The wafer W with smaller rounded edge at the border region between the first principal surface W1 and the notch chamfered portion $N_C$ can be thus obtained through the above process.

Further, the wafer W, whose rounded amount (edge-rounded amount) at the border region between the first principal surface W1 and the notch chamfered portion $N_C$ is smaller than the rounded amount at the border region between the first principal surface W1 and the outer-periphery chamfered portion $W_C$, can be obtained.

Effect of Exemplary Embodiment

According to the above exemplary embodiment, the rounded edge R2 at the border region between the first principal surface W1 and the notch chamfered portion $N_C$ can be reduced simply by performing the notch mirror-polishing step before the double-side polishing step in the typical manufacturing method of the wafer W as exemplified by the related art. Accordingly, the flatness of the part near the notch N can be improved without changing the shape of the notch N as in the disclosure of Patent Literature 1.

Examples

Next, the invention will be described in further detail below with reference to Example and Comparative. It should however be noted that the invention is by no means limited by these Example and Comparative.

Preparation of Samples

Initially, twelve wafers W were prepared. The prepared twelve wafers W as shown in FIG. 5B each had a notch N whose width Nw was 3.3 mm and whose depth $N_D$ was 1.13 mm.

Then, six of the wafers W were subjected to a process according to the wafer manufacturing method of the related art as shown in FIG. 1 to obtain samples of Comparative 1.

The remaining six of the wafers W were subjected to a process according to the wafer manufacturing method of the exemplary embodiment as shown in FIG. 7 to obtain samples of Example 1.

Comparative 1 and Example 1, which used the same polishing apparatus under the same conditions, were different only in terms of the order for performing the steps. The conditions in the respective steps are shown in Table 1.

TABLE 1

| Notch mirror-polishing | Inclination angle α | 50 degrees |
|---|---|---|
| | Inclined polishing time | 20 sec. |
| | Polishing load | 6 N |
| | Margin | 4 μm |
| Double-side polishing | Margin | 15 μm |
| Finish-polishing | Margin | 1.0 μm |

Evaluation

ESFQR (Edge flatness metric, Sector based, Front surface referenced, least sQuares fit reference plane, Range of the data within sector) of the outer peripheral portion of each of the wafers W was measured using a flatness measurement machine Wafersight 2 (manufactured by KLA-Tencor corporation). The ESFQR was measured for each of sites of the wafer W, the sites being defined by equally dividing an annular region located between first and second circles that were respectively 2 mm and 32 mm remote from the outermost circumference toward the center of the wafer W (i.e. annular region of 30-mm width of the wafer W except for 2-mm outermost circumferential portion) in 72 sections in a circumferential direction.

A notch-flatness index V represented by a formula (1) below was calculated, where V1 represented the ESFQR of a site including the notch N of each of the wafers W (referred to as "notch ESFQR" hereinafter) and V2 represented a maximum value of the ESFQR of other sites (referred to as "outer-periphery maximum ESFQR" hereinafter). Evaluation results of Comparative 1 and Example 1 are shown in FIG. 8.

$$V = V1 - V2 \quad (1)$$

As shown in FIG. 8, the notch-flatness index V of Example 1 was smaller than Comparative 1. Further, the average of the notch-flatness indexes V of Example 1 was −2.91 nm, and the average of the notch-flatness indexes V of Comparative 1 was 4.53 nm.

The comparison between the wafer manufacturing methods of the related art and the exemplary embodiment shows that, though the rounded edge is formed in the same manner at the border region between the first principal surface W1 and the outer-periphery chamfered portion $W_C$ in both methods, the rounded edge formed at the border region between the first principal surface W1 and the notch chamfered portion $N_C$ is different between the wafer manufacturing methods of the related art and the exemplary embodiment. The small notch-flatness index V means that Example 1 exhibits substantially the same outer-periphery maximum ESFQR (V2) as Comparative 1 and smaller notch ESFQR (V1) than Comparative 1.

From the above, it is confirmed that the flatness of the part of the wafer near the notch can be improved and the flatness of the entire outer peripheral portion of the wafer can also be improved by performing the wafer manufacturing method of the invention.

Further, the negative value of the notch-flatness index V of Example 1 means that the notch ESFQR (V1) is smaller than the outer-periphery maximum ESFQR (V2).

From the above, the wafer W, whose edge roll-off amount at the border region between the first principal surface W1 and the notch chamfered portion $N_C$ is smaller than the edge roll-off amount at the border region between the first principal surface W1 and the outer-periphery chamfered portion $W_C$, can be obtained by performing the wafer manufacturing method of the invention.

The invention claimed is:

1. A manufacturing method of a wafer comprising a notch, the method comprising:
    mirror-polishing a notch chamfered portion of the notch in a manner such that polishing progresses while a polishing pad extends over a first principal surface and a second principal surface of the wafer;
    polishing the first and second principal surfaces of the wafer;
    mirror-polishing an outer-periphery chamfered portion of an outer periphery of the wafer; and
    finish-polishing the first principal surface of the wafer, wherein
    the finish-polishing is performed after performing the mirror-polishing of the notch chamfered portion, the polishing of the first and second principal surfaces, and the mirror-polishing of the outer periphery chamfered portion in this order.

2. The manufacturing method of a wafer according to claim 1, wherein
the wafer is a silicon wafer.

3. A wafer comprising a notch, wherein
an edge roll-off amount of a notch chamfered portion of the notch is smaller than an edge roll-off amount of an outer-periphery chamfered portion of an outer peripheral portion of the wafer.

* * * * *